(12) United States Patent
Lee et al.

(10) Patent No.: US 8,399,276 B2
(45) Date of Patent: Mar. 19, 2013

(54) ELECTRO-OPTIC DEVICE AND METHOD FOR MANUFACTURING THE SAME

(75) Inventors: Hyung Sup Lee, Suwon-si (KR); Chi Wook Yu, Yongin-si (KR); Sung Hui Lee, Anyang-si (KR)

(73) Assignee: Jusung Engineering Co., Ltd., Seoul (KR)

( * ) Notice: Subject to any disclaimer, the term of this patent is extended or adjusted under 35 U.S.C. 154(b) by 272 days.

(21) Appl. No.: 12/832,786

(22) Filed: Jul. 8, 2010

(65) Prior Publication Data

US 2011/0012094 A1    Jan. 20, 2011

(30) Foreign Application Priority Data

Jul. 15, 2009    (KR) .................. 10-2009-0064482

(51) Int. Cl.
*H01L 21/00*        (2006.01)
(52) U.S. Cl. .............. 438/47; 438/66; 438/463
(58) Field of Classification Search ............ 438/47, 438/66, 463
See application file for complete search history.

(56) References Cited

U.S. PATENT DOCUMENTS

| | | | | |
|---|---|---|---|---|
| 5,106,452 | A * | 4/1992 | Kadono et al. ............... | 438/105 |
| 5,500,539 | A * | 3/1996 | Kadono et al. ............... | 257/77 |
| 6,693,296 | B1 * | 2/2004 | Tyan ........................... | 257/40 |
| 7,034,470 | B2 * | 4/2006 | Cok et al. .................... | 315/249 |
| 7,122,398 | B1 * | 10/2006 | Pichler ........................ | 438/66 |
| 7,867,369 | B2 * | 1/2011 | Bhullar et al. .............. | 204/403.02 |
| 8,062,834 | B2 * | 11/2011 | Lee et al. .................... | 430/313 |
| 8,137,148 | B2 * | 3/2012 | Farquhar et al. ............ | 445/24 |
| 2001/0055454 | A1 * | 12/2001 | Roach et al. ................. | 385/123 |
| 2001/0055458 | A1 * | 12/2001 | Ladd ............................ | 385/129 |
| 2004/0031957 | A1 * | 2/2004 | Tyan ............................ | 257/40 |
| 2004/0032220 | A1 * | 2/2004 | Cok et al. ..................... | 315/291 |
| 2005/0023137 | A1 * | 2/2005 | Bhullar et al. .............. | 204/403.1 |
| 2007/0065962 | A1 * | 3/2007 | Pichler ........................ | 438/47 |
| 2009/0170036 | A1 * | 7/2009 | Lee et al. ..................... | 430/314 |
| 2009/0178702 | A1 * | 7/2009 | Pichler ........................ | 136/244 |
| 2009/0294157 | A1 * | 12/2009 | Lee et al. ..................... | 174/256 |
| 2011/0012094 | A1 * | 1/2011 | Lee et al. ..................... | 257/40 |
| 2011/0014357 | A1 * | 1/2011 | Lim et al. .................... | 427/77 |
| 2011/0048506 | A1 * | 3/2011 | Pichler ........................ | 136/251 |
| 2011/0074281 | A1 * | 3/2011 | Farquhar et al. ............ | 313/504 |
| 2011/0139216 | A1 * | 6/2011 | Lee et al. ..................... | 136/244 |

(Continued)

*Primary Examiner* — Laura Menz
(74) *Attorney, Agent, or Firm* — The Law Offices of Andrew D. Fortney; Andrew D. Fortney

(57) ABSTRACT

Provided are an electro-optic device and a method for manufacturing the same. The method includes forming a bottom electrode on a substrate, forming a first insulation film to cross over the bottom electrode forming an organic film on the substrate where the bottom electrode and the first insulation film are formed, forming a top electrode film on the organic film, and forming a top electrode to cross the bottom electrode by removing a portion of the top electrode film through a laser-scribing process. Herein, in the forming of the top electrode through the laser-scribing process, an edge region of a bottom surface of the top electrode may be positioned corresponding to an upper side of the first insulation film. Therefore, it is possible to reduce the number of processing apparatuses and steps required for separately forming the plurality of top electrodes, thereby simplifying manufacturing processes and saving manufacturing cost. Furthermore, since an insulation film is formed under an edge region of a top electrode, it is possible to prevent the generation of leakage current and the malfunction of a device caused by the deformation of the top electrode even though the edge region of the top electrode is damaged during a laser-scribing process. Thus, the reliability of electro-optic devices can be improved.

20 Claims, 5 Drawing Sheets

U.S. PATENT DOCUMENTS

2011/0189811 A1* 8/2011 Stephens et al. ............... 438/72
2011/0275193 A1* 11/2011 Brunton ...................... 438/463
2011/0312158 A1* 12/2011 Brunton ...................... 438/463
2011/0315432 A1* 12/2011 Lee et al. ...................... 174/251

* cited by examiner

ELECTRO-OPTIC DEVICE AND METHOD FOR MANUFACTURING THE SAME

CROSS-REFERENCE TO RELATED APPLICATION

This application claims priority to Korean Patent Application No. 10-2009-0064482 filed on Jul. 15, 2009 and all the benefits accruing therefrom under 35 U.S.C. §119, the contents of which are incorporated by reference in their entirety.

BACKGROUND

The present disclosure relates to an electro-optic device and a method for manufacturing the same, and more particularly, to an electro-optic device capable of simplifying a top electrode forming process by removing a portion of a top electrode film and thus forming a top electrode using a laser-scribing process, and a method for manufacturing the electro-optic device.

In general, an organic light-emitting display, in which a plurality of organic light-emitting devices (OLEDs) are provided on a single substrate, includes a substrate, a plurality of bottom electrodes formed on the substrate, an insulation film covering an edge region of the bottom electrode, a plurality of organic films formed on the plurality of bottom electrodes, a top electrode formed on the organic film to cross the plurality of bottom electrodes, and a partition dividing the top electrode into plural parts so as to allow a plurality of OLEDs to be separately driven. In brief, a related art method for manufacturing an organic light emitting display begins with depositing a transparent conductive material, e.g., indium tin oxide (ITO) on an entire surface of a substrate. Then, a photolithographic process is performed to thereby form a plurality of bottom electrodes. An insulation film is thereafter formed on an edge region of the bottom electrode, that is, an edge region of a top surface and a side surface of the bottom electrode. Next, to separate top electrodes to be formed in a subsequent process, a partition is formed in such a way that it crosses the bottom electrode. Here, the partition having a height of 5 μm or more is formed by coating the substrate with negative photoresist, and then performing a photolithographic process on the resultant. Afterwards, an organic layer is formed on the substrate. Subsequently, a top electrode is formed by depositing a metal thin film on an entire surface of the substrate where the bottom electrode and the organic layer are formed. The metal thin films are separated by the partition, and thus serve as the plurality of top electrodes. In virtue of the partition and the top electrode so formed, the plurality of OLEDs can be separately driven.

However, in the case of forming the partition using the photolithographic process like the related art method, several manufacturing steps should be required. Therefore, the manufacturing process is too complicated, which leads to an increase in photolithographic process time, and increase in manufacturing cost as well.

SUMMARY

The present disclosure provides an electro-optic device that can simplify a top electrode forming process by removing a portion of a top electrode film formed on an entire surface of a substrate through a laser-scribing process to thereby separately form a plurality of top electrodes, and a method for manufacturing the electro-optic device.

In accordance with an exemplary embodiment, a method for manufacturing an electro-optic device includes: forming a bottom electrode on a substrate; forming a first insulation film to cross over the bottom electrode; forming an organic film on the substrate where the bottom electrode and the first insulation film are formed; forming a top electrode film on the organic film; and forming a top electrode to cross the bottom electrode by removing a portion of the top electrode film through a laser-scribing process. Herein, in the forming of the top electrode through the laser-scribing process, an edge region of a bottom surface of the top electrode may be positioned corresponding to an upper side of the first insulation film.

In the forming of the top electrode through the laser-scribing process, a portion of the organic film disposed under the top electrode film may be removed to form an organic pattern, and a portion of the first insulation film disposed under the organic film may be removed at the same time.

A laser used in the laser-scribing process may be smaller in width than the first insulation film, and the laser may be positioned corresponding to the center of an upper side of the first insulation film.

A central region of the first insulation film, an organic film corresponding to an upper side of the central region of the first insulation film, and a portion of the top electrode film may be removed while the laser moves along a region corresponding to the central region of the upper side of the first insulation film over the top electrode film during the laser-scribing process.

An organic pattern and an edge region of the top electrode may be disposed corresponding to an upper side of the edge region of the first insulation film with the central region thereof removed.

The method may include forming a second insulation film covering an edge region of the bottom electrode, wherein the second insulation film is parallel with the bottom electrode and crosses the top electrode and the first insulation film.

The first and second insulation films may be formed simultaneously.

The first and second insulation films may be formed of one of an organic material, an inorganic material and an oxide.

The first and second insulation films may be formed using one of a printing process and a photolithographic process.

In accordance with another exemplary embodiment, an electro-optic device includes: a top electrode crossing over the bottom electrode; and a first insulation film corresponding to a lower side of an edge region of the top electrode and crossing the bottom electrode and disposed in parallel with the top electrode. The electro-optic device may include a second insulation film disposed in parallel with the bottom electrode and covering an edge region of the bottom electrode.

An organic pattern may be disposed between the top electrode and the bottom electrode, and the edge region of the organic pattern may be disposed on the first insulation film.

BRIEF DESCRIPTION OF THE DRAWINGS

Exemplary embodiments can be understood in more detail from the following description taken in conjunction with the accompanying drawings, in which:

FIGS. 1A through 5A are top views illustrating a method for manufacturing an electro-optic device according to an exemplary embodiment; and FIGS. 1B through 5B are sectional views taken along line A-A' of FIGS. 1A through 5A.

DETAILED DESCRIPTION OF EMBODIMENTS

Figure 1A:
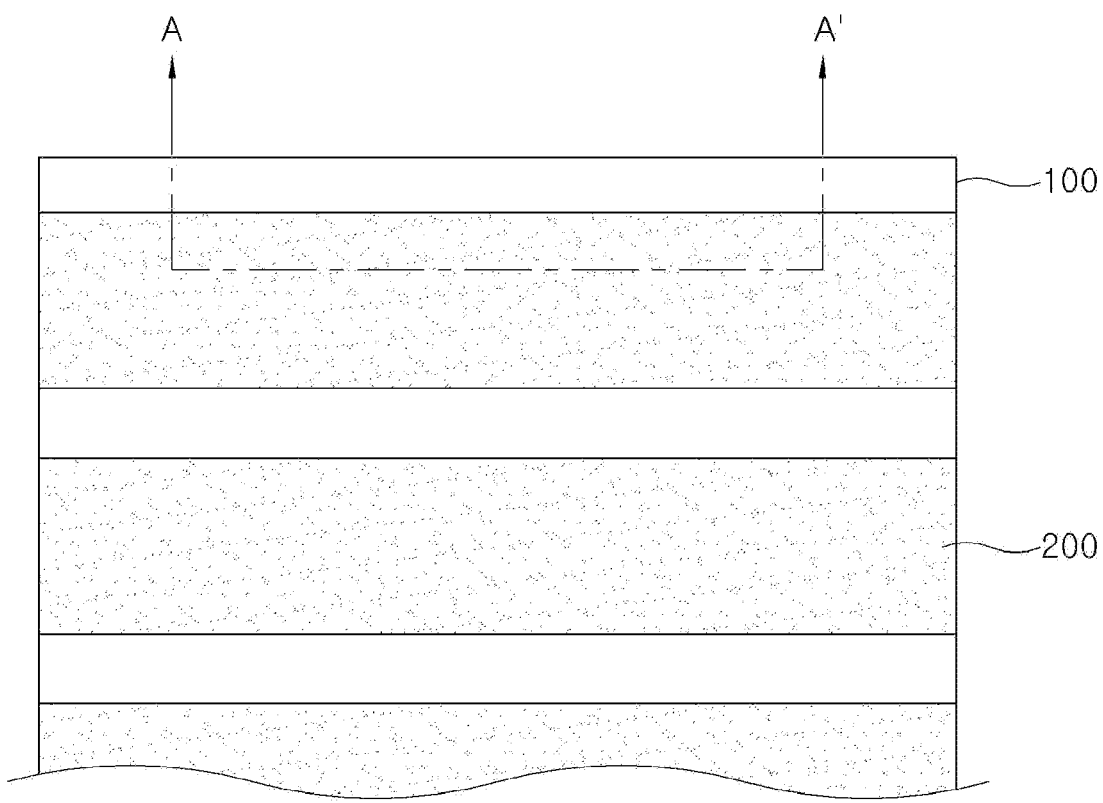

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, like reference numerals refer to like elements throughout.

FIGS. 1A through 5A are top views illustrating a method for manufacturing an electro-optic device according to an exemplary embodiment, and FIGS. 1B through 5B are sectional views taken along line A-A' of FIGS. 1A through 5A.

A method for manufacturing an electro-optic device according to an exemplary embodiment relates to a method for manufacturing an electro-optic device, enabling to simplify a process of separately forming a plurality of top electrodes 600b and to increase the reliability of devices. A method for manufacturing an electro-optic device according to an exemplary embodiment will be described below with reference to FIGS. 1A through 5A, and FIGS. 1B through 5B.

Figure 1B:
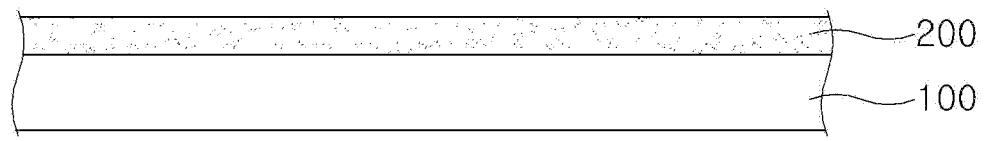

Referring to FIGS. 1A and 1B, a plurality of bottom electrodes 200 are formed on a substrate 200. The substrate may use any one of plastic substrates (e.g., PES, PEN, or the like) and glass substrates having light transmittance of 80% or more, but the present invention is not limited thereto. That is, the substrate 100 may use other various substrates such as a thin silicon substrate and a sapphire substrate. In this exemplary embodiment, a glass substrate is used as the substrate 100. The plurality of bottom electrodes 200 are formed on this substrate 100. Here, each of the plurality of bottom electrodes 200 extends in a predetermined direction over the substrate 100. Although not shown, the bottom electrodes 200 may be prepared by depositing a transparent conductive material, e.g., one of indium tin oxide (ITO), indium zinc oxide (IZO), zinc oxide (ZnO) and indium oxide ($In_2O_3$), on the substrate 100, and then patterning the deposited conductive film. In this exemplary embodiment, the plurality of bottom electrodes 200 are prepared by depositing a transparent conductive material such as ITO on the substrate 100 using a sputtering process, and then patterning the deposited transparent conductive film through photolithography. However, the present invention is not limited to the above-described method, and thus the transparent conductive material for the bottom electrode 200 may be deposited using various deposition process in addition to the sputtering process. Also, the bottom electrode 200 may be formed by patterning the transparent conductive film using wet etching, scribing, printing, or the like.

Figure 2A:
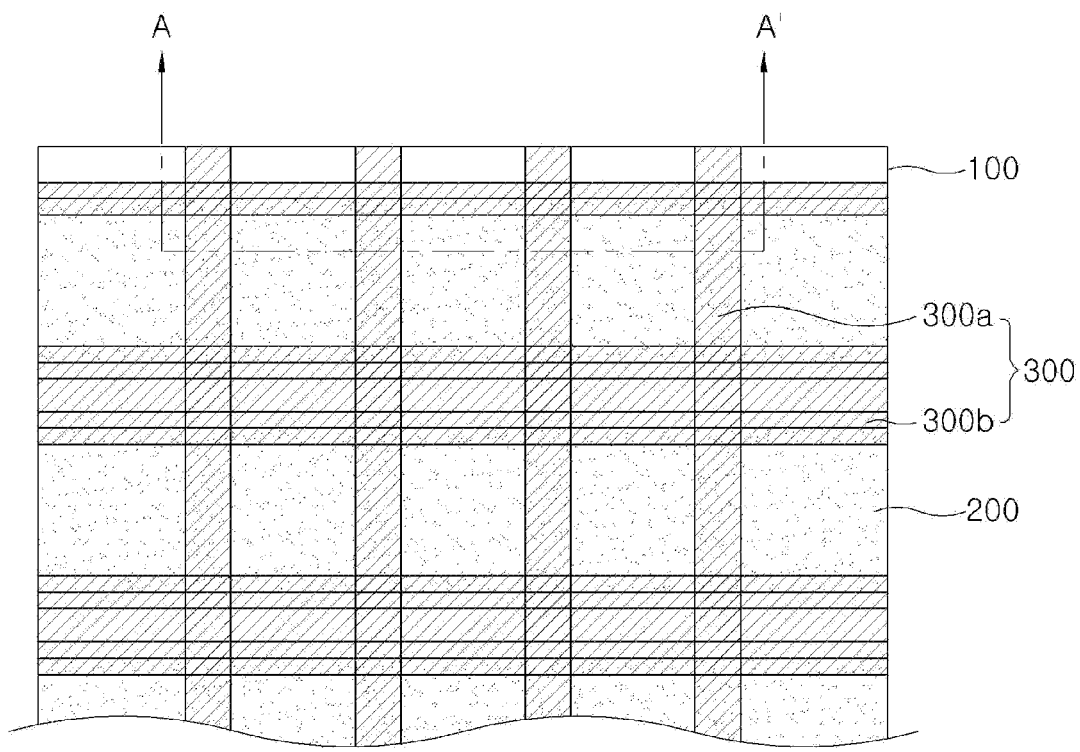
Figure 2B:
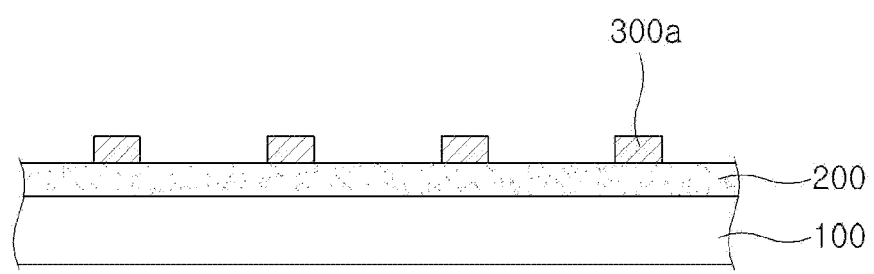

Referring to FIGS. 2A and 2B, an insulation film 300 is formed on the plurality of bottom electrodes 200. The insulation film 300 according to the exemplary embodiment includes a plurality of first insulation films 300a and a plurality of second insulation films 300b. The plurality of first insulation films 300a are formed crossing the bottom electrode 200, and the plurality of second insulation films 300b are formed in parallel with the bottom electrode 200. Here, the first insulation film prevents an edge region of a top electrode 600b (to be formed later) from contacting an organic layer 500, thereby preventing the generation of leakage current and the malfunction of a device. The first insulation film 300a is formed on the bottom electrode 200 such that it crosses the bottom electrode 200 and is parallel with the top electrode 600b. The first insulation film 300a may be formed in such a manner that the edge region of the bottom side of the top electrode is positioned over the first insulation film 300a. Also, the second insulation film 300b is disposed in parallel with the bottom electrode 200 to thereby cover the edge region of the bottom electrode 200. That is, the second insulation film 300b is formed to cover the edge region of the top surface and the side surface of the bottom electrode 200. Here, the second insulation film 300b serves a role of covering the edge region of the bottom electrode 200 which may be deformed during the forming process of the bottom electrode 200. Resultantly, the first insulation film 300a is formed to cross the bottom electrode 200, and the second insulation film 300b is formed in parallel with the bottom electrode 200. The first and second insulation films 300a and 300b are formed of organic materials such as photoresist (PR), inorganic materials such as nitride, or oxides such as alumina ($Al_2O_3$). In the exemplary embodiment, the first and second insulation films 300a and 300b are formed by coating an organic material using a screen printing which is one of printing methods. In brief, a stencil mask, which exposes the edge region of the bottom electrode 200 and an edge region of the top electrode 600b, is disposed on the substrate 100. The stencil mask includes a first opening part that is formed to cross the bottom electrode 200 and exposes the edge region of the top electrode 600b, and a second opening part that is formed in parallel with the bottom electrode 200 and exposes the edge region of the bottom electrode 200. Thereafter, an insulating coating material is applied on the stencil mask. Here, the coating material on the stencil mask is moved using a squeezer, and the insulating coating material is filled into an opening region of the stencil mask and then patterned. As a result, the first insulation film 300a is formed to cross the bottom electrode 200, and the second insulation film 300b is formed to be parallel with the bottom electrode 200. The first insulation film 300a is formed corresponding to the edge region of the top electrode 600b to be formed later. The second insulation film 300a is formed on the edge region of the top surface and the side surface of the bottom electrode 200. In this way, according to the exemplary embodiment, the first insulation film 300a and the second insulation film 300b are simultaneously formed on the bottom electrode 200 through single screen printing. In the case of related art OLEDs, although not shown, only one insulation film covering the edge region of the bottom electrode is formed on the bottom electrode. In the exemplary embodiment, however, the first insulation film 300a which positioned corresponding to the lower portion of the edge region of the top electrode 600b during the existing process of forming the second insulation film 300b covering the edge region of the bottom electrode 200. That is, the first and second insulation films 300a and 300b are simultaneously formed on the bottom electrode 200 through single process. Thus, it is unnecessary to additionally perform a process of forming the first insulation film 300a that is positioned corresponding to the lower portion of the edge region of the top electrode 600b. Accordingly, even with the same processing time, it is possible to form not only the second insulation film 300b covering the edge region of the bottom electrode 200, but also the first insulation film 300a corresponding to the lower portion of the edge region of the top electrode 600b. Although the insulation film 300 is formed through the screen printing process in the exemplary embodiment, the present invention is not limited thereto, and thus various printing methods may be available. That is, the first and second insulation films 300a and 300b may be formed using one of pen-printing, roller-printing, and gravure-printing. Also, the first and second insulation films 300a and 300b may be formed by applying photoresist on the substrate 100 with the bottom electrode 200 formed, and patterning the photoresist film through photolithography.

Figure 3A:
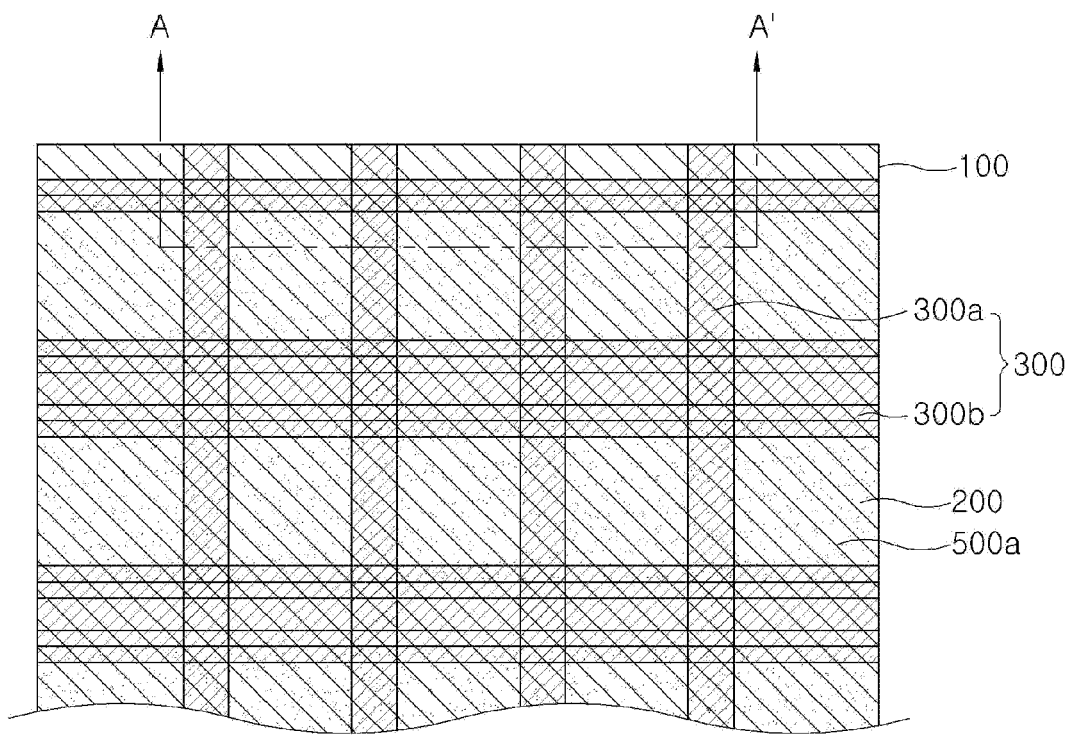
Figure 3B:
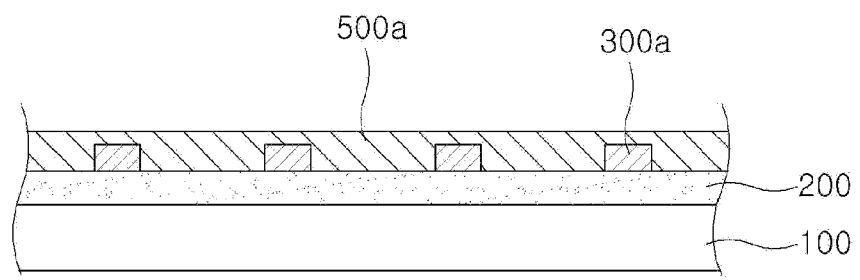

Referring to FIG. 3A and FIG. 3B, an organic film 500a for an organic pattern 500b is formed on the entire surface of the substrate 100 where a bottom electrode 200, the first insulation film 300a and the second insulation film 300b are formed. Although not shown, the organic film 500a includes a hole injection layer, a hole transport layer, an emitting layer, and an electron transport layer. The organic film 500a is formed by sequentially stacking the hole injection layer, the hole transport layer, the emitting layer, and the electron transport layer. Organic materials forming the organic layer 500a may be added or omitted, if necessary. For example, materials that efficiently inject holes, such as CuPc, 2T-NATA, and MTDA, are used to form the hole injection layer on the bottom electrode 200. In addition, materials that may efficiently transfer holes, such as NPB and TPD, are used to form the hole transport layer on the hole injection layer. Subsequently, the emitting layer is formed on the hole transport layer. The emitting layer may include a green emitting layer consisting of $Alp_3$:C545T, a blue emitting layer consisting of DPVBi, a red emitting layer consisting of CBP:Ir (acac), and materials that comprised of the groups thereof and have excellent emitting characteristics.

Subsequently, materials that may efficiently transfer electrons, such as Alq3, are used to form the electron transport layer. These organic materials are deposited by thermal evaporation to thereby form an organic layer 500. Of course, the present invention is not limited to the above, and thus the organic film 500a may be formed by various methods according to organic materials constituting the organic layer 500.

Figure 4A:
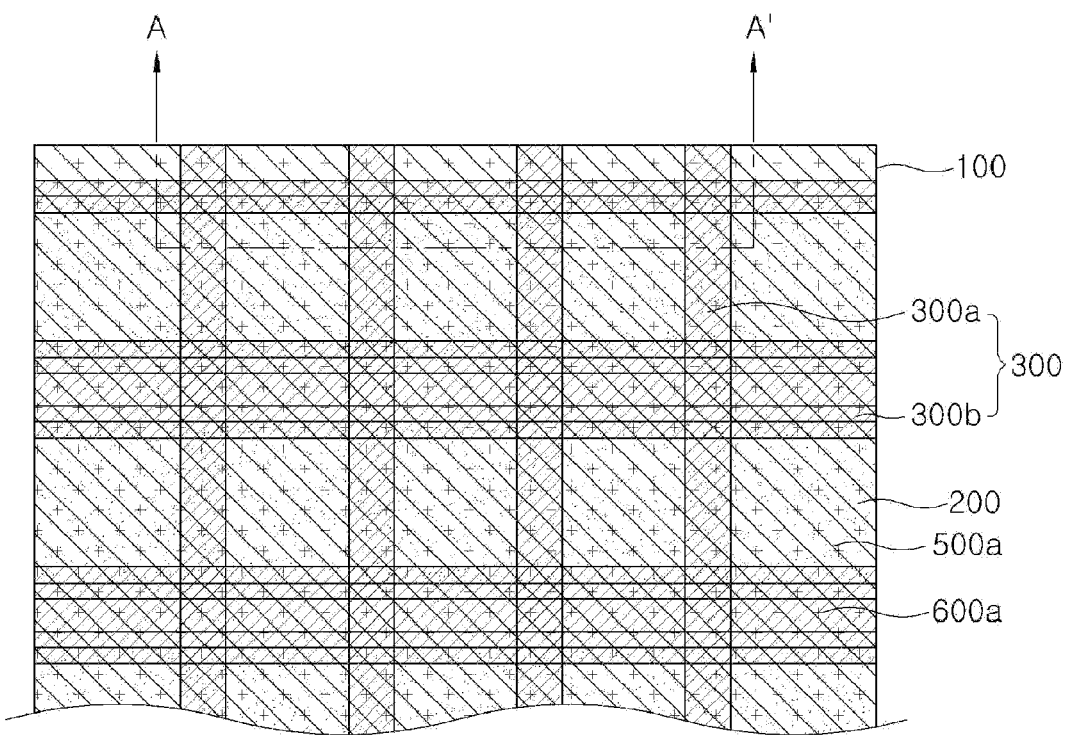
Figure 4B:
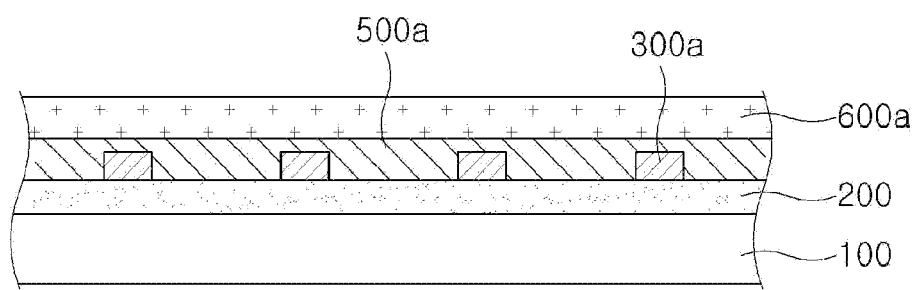
Figure 5A:
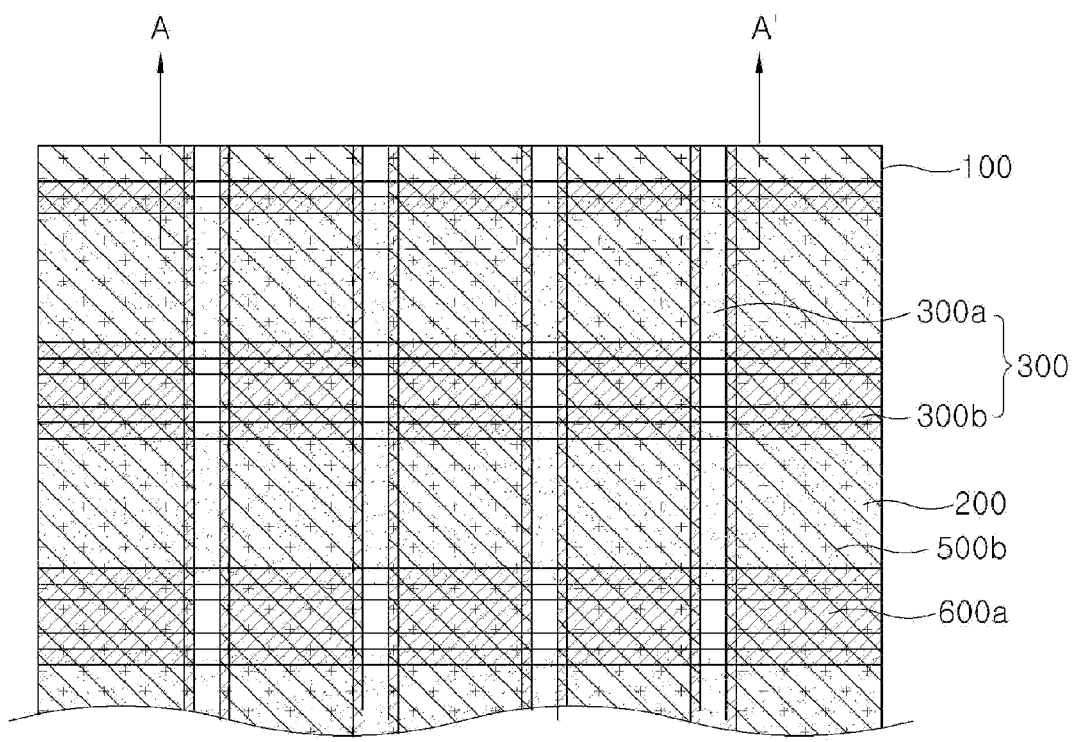
Figure 5B:
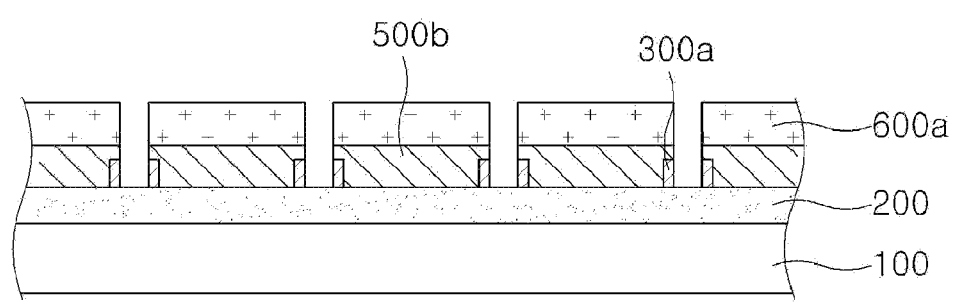

Referring to FIG. 4A and FIG. 4B, a top electrode film 500a for a top electrode 600b is formed on the entire surface of the substrate 100 where the bottom electrode 200, the first insulation film 300a, the second insulation film 300b, and the organic film 500a are formed. In the exemplary embodiment, the top electrode film 600a is formed on the substrate 100 by thermal evaporation using one selected from LiF, Al, Ag, Ca, Cu, and an alloy thereof Subsequently, as illustrated in FIG. 5A and FIG. 5B, a portion of the top electrode film 600a is removed by a laser-scribing process to form a plurality of top electrodes 600b. The plurality of top electrodes 600b may be formed to extend in a direction crossing the bottom electrode 200. To this end, the laser is shifted to cross the bottom electrode 200 and the portion of the top electrode film 600a is removed such that the top electrode 600b may cross the bottom electrode 200. The width of the laser used in the scribing process may become smaller than the width of the first electrode film 300a, and the laser may be disposed to correspond to the top side central region of the first electrode film 300a. Consequently, the portion of the top electrode film 600a formed on the first electrode film 300a is removed to form the plurality of top electrodes 600b. Some portions of the organic film 500a and the first insulation film 300a disposed below the top electrode film 600a are also removed during the laser-scribing process at the same time. Consequently, as illustrated in FIG. 5B, the organic film 500a is patterned in the same form as the top electrode 600b to form an organic pattern 500b. An edge region of the organic pattern 500b so patterned is disposed on the first insulation film 300a. The first insulation film 300a has a form where the central region is removed during the laser-scribing process as described above, and the organic pattern 500b and an edge region of the top electrode 600a are disposed over an edge region of the first insulation film 300a. Because the top electrode 600b patterned by the laser-scribing process and an edge region of the organic pattern 500b are disposed on the first insulation film 300a, the generation of leakage current and the malfunction of device may be prevented. When some portions of the top electrode film 600a are removed by the laser-scribing process to form the top electrode 600b, an edge region of the top electrode 600 may be modified by high heat or energy during the laser-scribing process. Some portions of the organic film 500a disposed below the top electrode film 600a are removed during this laser-scribing process, and an edge region of the organic pattern 500b may be modified by high heat or energy during the process. However, in the exemplary embodiment, the first insulation film 300a may be correspondingly disposed below the top electrode 600b and an edge region of the organic pattern 500b to prevent the generation of leakage current and the malfunction of device even though the top electrode 600b and the edge region of the organic pattern 500b may be damaged during the laser-scribing process. The top electrode 600b is manufactured, and then a cleaning process is performed to remove particles generated during the laser-scribing process. In this exemplary embodiment, the particles are removed by a dry cleaning method using a suction device. Although not shown, interconnection is formed such that each of the bottom electrode 200 and the top electrode may be connected to an external power source.

In the exemplary embodiment, an insulation film 300, including the plurality of first insulation films 300a formed on a plurality of bottom electrodes 200 to cross the bottom electrode 200 and the plurality of second insulation films 300b formed to be parallel with the bottom electrode 200, is formed. The first insulation film 300a may be disposed below the top electrode 600b and an edge region of the organic pattern 500b to manufacture an electro-optic device such that the electro-optic device characteristics may not be affected even though the top electrode 600b and an edge of the organic pattern are damaged during the laser scribing process. The second insulation film 300b are disposed in parallel with the bottom electrode 200 to play a role in covering an edge region of the bottom electrode 200 which may be modified during a process forming the bottom electrode 200. In embodiments, in conventionally forming the second insulation film 310b which covers an edge region of the bottom electrode 200, the first insulation film 300a is formed to be correspondingly disposed below an edge region of the top electrode 600 which is subsequently formed. Consequently, an additional process time is not given in order to form the first insulation film 300a to be correspondingly disposed below an edge region of the top electrode 600b. Therefore, not only the second insulation film 300b covering an edge region of the bottom electrode 200, but also the first insulation film 300a to be correspondingly disposed below an edge of the top electrode 600b, may be formed with the same process time as the conventional method.

In the exemplary embodiment, the plurality of top electrodes 600b may be separately formed even though forming a partition is omitted. Some portions of the top electrode films 600b may be removed by the laser-scribing process to separately form the plurality of top electrodes 600b. Thus, a process for forming a plurality of top electrodes 600b may be simplified, compared to conventional methods. Although an edge region of the top electrode 600b is damaged during the laser-scribing, the generation of leakage current and the malfunction of device may be prevented as the first insulation film 300a may be correspondingly disposed below the edge region of the top electrode 600b.

In the exemplary embodiment, although a method for separately forming a top electrode 600b is described by exemplifying an organic light emitting device, it is not limited thereto and it may be applied to various electro-optical devices which separately form the plurality of top electrodes 600b.

As described above, according to the exemplary embodiments, a plurality of top electrodes are separately formed by partially removing a top electrode film formed on an entire surface of a substrate through a laser-scribing process. Accordingly, it is possible to reduce the number of processing apparatuses and steps required for separately forming the plurality of top electrodes, thereby simplifying manufacturing processes and saving manufacturing cost.

Furthermore, since an insulation film is formed under an edge region of a top electrode, it is possible to prevent the generation of leakage current and the malfunction of a device caused by the deformation of the top electrode even though the edge region of the top electrode is damaged during a laser-scribing process. Thus, the reliability of electro-optic devices can be improved.

Although the electro-optic device and a method for manufacturing the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A method for manufacturing an electro-optic device comprising:
   forming a bottom electrode on a substrate;
   forming a first insulation film over the bottom electrode;
   forming an organic film on or over the substrate, the bottom electrode, and the first insulation film;
   forming a top electrode film on or over the organic film; and
   forming a top electrode over and crossing the bottom electrode by removing a portion of the top electrode film and a portion of the first insulation film using a laser-scribing process, wherein an edge region of the top electrode is aligned with an edge region of the first insulation film after the laser scribing process.

2. The method of claim 1, wherein the top electrode crosses over the bottom electrode at a right angle from an overhead view.

3. The method of claim 1, wherein the laser-scribing process also removes (i) a portion of the organic film to form an organic pattern, and (ii) a portion of the first insulation film under the removed portion of the organic film.

4. The method of claim 1, wherein a laser used in the laser-scribing process has a smaller width than a width of the first insulation film.

5. The method of claim 4, wherein the laser is positioned at a center of the width of the first insulation film and over an upper surface of the first insulation film, and the laser moves along a length of the first insulation film during the laser-scribing process.

6. The method of claim 5, wherein the laser-scribing process comprises removing a central region of the first insulation film, a portion of the organic film over the central region of the first insulation film, and a portion of the top electrode film over the central region of the first insulation film as the laser moves along the length of the first insulation film and over the top electrode film, thereby forming an organic film pattern, a first insulation film pattern, and the top electrode.

7. The method of claim 6, wherein a vertical sidewall of the organic film pattern and the edge region of the top electrode are aligned with a vertical sidewall of the first insulation film pattern after the laser-scribing process.

8. The method of claim 1, further comprising forming a second insulation film along a length of the bottom electrode and covering an edge region of the bottom electrode, wherein the second insulation film crosses the top electrode and the first insulation film.

9. The method of claim 8, wherein the first and second insulation films are formed simultaneously.

10. The method of claim 8, wherein each of the first and second insulation films comprises an organic material, an inorganic material, or an oxide.

11. The method of claim 10, wherein the first and second insulation films are formed using a printing process or a photolithographic process.

12. The method of claim 9, wherein the first and second insulation films are formed using a screen printing process.

13. The method of claim 1, wherein portions of the first insulation film are at opposite sides of the organic film after the laser-scribing process.

14. The method of claim 3, wherein portions of the first insulation film are at opposite sides of the organic film after the laser-scribing process.

15. The method of claim 7, wherein vertical sidewalls at opposite sides of the organic film pattern and edge regions at opposite sides of the top electrode are aligned with vertical sidewalls at opposite sides of the first insulation film pattern after the laser-scribing process.

16. The method of claim 1, wherein the organic film comprises a hole injection layer, a hole transport layer, an emitting layer, and an electron transport layer.

17. The method of claim 16, wherein the emitting layer comprises a green emitting layer, a blue emitting layer, and a red emitting layer.

18. The method of claim 1, wherein the substrate comprises a plastic or glass substrate having a light transmittance of 80% or more.

19. The method of claim 1, wherein the bottom electrode comprises indium tin oxide (ITO), indium zinc oxide (IZO), zinc oxide (ZnO), and/or indium oxide ($In_2O_3$).

20. The method of claim 1, wherein the top electrode comprises LiF, Al, Ag, Ca, Cu, or an alloy thereof.

* * * * *